(12) United States Patent
Jones, Jr.

(10) Patent No.: US 6,788,122 B2
(45) Date of Patent: Sep. 7, 2004

(54) CLOCK CONTROLLED POWER-DOWN STATE

(75) Inventor: Oscar Frederick Jones, Jr., Colorado Springs, CO (US)

(73) Assignees: United Memories, Inc., Colorado Springs, CO (US); Sony Corporation, Tokyo (JP)

(*) Notice: Subject to any disclaimer, the term of this patent is extended or adjusted under 35 U.S.C. 154(b) by 0 days.

(21) Appl. No.: 10/354,307

(22) Filed: Jan. 30, 2003

(65) Prior Publication Data
US 2004/0150448 A1 Aug. 5, 2004

(51) Int. Cl.[7] .............................................. H03K 3/289
(52) U.S. Cl. ...................... 327/202; 327/200; 327/203
(58) Field of Search .................................. 327/200, 202, 327/201, 203, 208, 210, 211, 212, 199, 209

(56) References Cited

U.S. PATENT DOCUMENTS

| 4,843,254 | A | * | 6/1989 | Motegi et al. | 327/203 |
|---|---|---|---|---|---|
| 5,973,529 | A | * | 10/1999 | Chappell et al. | 327/200 |
| 6,169,419 | B1 | | 1/2001 | De et al. | 326/58 |
| 6,198,323 | B1 | * | 3/2001 | Offord | 327/202 |
| 6,231,147 | B1 | * | 5/2001 | Bosshart | 328/202 |

* cited by examiner

Primary Examiner—Tuan T. Lam
Assistant Examiner—Hiep Nguyen
(74) Attorney, Agent, or Firm—Peter J. Meza; William J. Kubida; Hogan & Hartson LLP

(57) ABSTRACT

A circuit and method reduces the number of nodes that must be forced during a standby mode when using clocked latches. The circuit and method can be used for half-cycle latches and full cycle latches in conjunction with alternate power-gated circuitry, even when many stages are cascaded in a pipeline structure. The data state on a single forcing node can be passed through one or more cascaded latch stages as well as through additional circuitry. By forcing latch transmission gates to be conductive during standby mode, multiple stages can be set to a specific state, as determined by an earlier stage being set by a forcing transistor. A clock generation. circuit and method is also provided for controlling transmission gates within the latches.

10 Claims, 9 Drawing Sheets

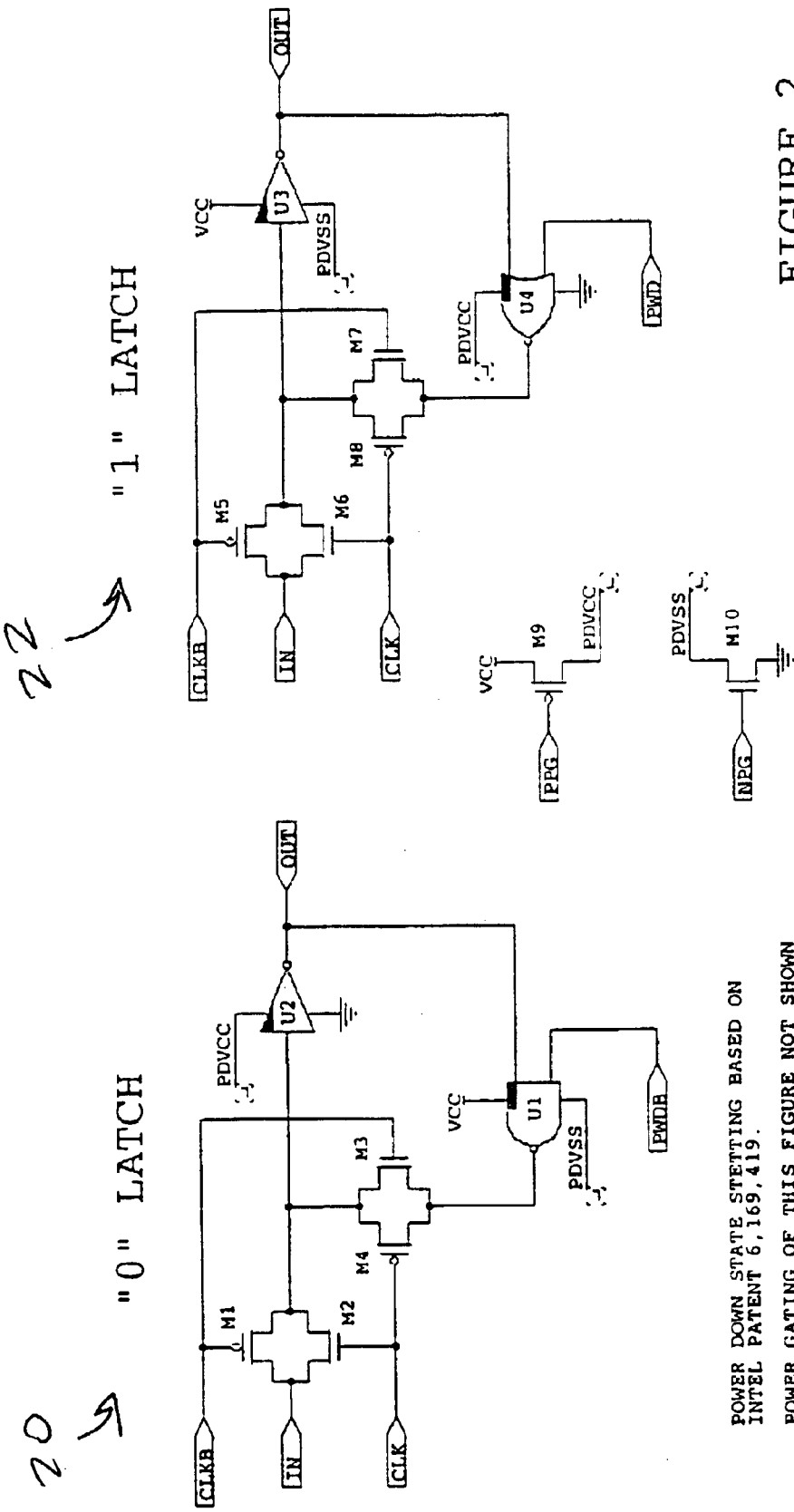

CLOCK CONTROLLED POWER-DOWN STATE

BACKGROUND

An embodiment of the present invention relates to integrated circuits, and more particularly, to a circuit and method for implementing a standby power-down state in the integrated circuit.

Referring now to FIG. 1, a circuit 10 is shown that can be used to power-gate serially-coupled CMOS inverters U1, U2, U3, U4, and U5 to reduce standby current due to subthreshold leakage. Every other inverter stage U1–U5 uses power-gating devices M5 and M6 to coupled the power terminals of the inverter stages to either VCC or VSS. However, the alternate power-gating method of operating circuit 10 requires that the input and output node voltages for each inverter stage be forced to a specific state for proper functionality. If the wrong data state is used, this technique will not work since the alternate power supply terminals are turned off. In FIG. 1, transistor M3 turns on and forces a low data state at the input node of inverter U1, which results in all subsequent stages U2–U5 going to the necessary standby levels. Transistor M4 is used to avoid contention when transistor M3 is on during standby. Transistor M5 is the positive VCC power supply gating device and transistor M6 is the ground or negative VSS power gating device. The NPG control node is high (goes to VCC or slightly higher than VCC) when circuit 10 is in non-standby mode and goes low when circuit 10 is in standby mode. PPG is low when circuit 10 is in non-standby mode and goes high when circuit 10 is in standby mode.

Asynchronous (ripple-through) logic, as illustrated in circuit 10 of FIG. 1, is relatively easy to use to enable standby states by forcing an early stage node (usually an input stage). However, with synchronous logic, especially where clocked flip-flops or pipelined stages are used, multiple points must be forced when power-gating during low power standby.

Referring now to FIG. 2, circuits 20 and 22 are operated such that nodes within a latch stage are forced to specific logic states during standby mode. The method of operation for circuits 20 and 22 is relatively complicated since it uses a NAND gate U1 in circuit 20 or a NOR gate U4 in circuit 22 as the feedback element and requires an additional transmission gate (M3, M4 is circuit 20 and M7, M8 in circuit 22) in the feedback path.

Circuits 30, 40, and 50 is corresponding FIGS. 3, 4, and 5 show an obvious method for setting logic states within latch stages. Each of circuits 30, 40, and 50 addresses how to force the stages based on different conditions of the clock during a low power standby mode. In circuits 30, 40, and 50, one or more "forcing" transistors must be added to set node states where the clock blocks signal propagation from a previous stage. In circuit 30 forcing transistors M7 and M11 are shown. In circuit 40 forcing transistors M7 and M12 are shown. In circuit 50 forcing transistors M7, M12, and M11 are shown. Adding two or more forcing transistors as shown in FIGS. 3–5 may not be a problem in some cases. In other cases, however, where latches are placed within a tight physical pitch or when many latches are clocked in parallel, such as for input data latches for embedded memories, it is desirable to minimize unnecessary transistors.

What is desired, therefore, is a circuit and method of operation for implementing a low power supply standby mode in an integrated circuit that uses a single forcing transistor, yet is able to work with synchronous signal paths including latch circuits as well as other logic circuits.

SUMMARY OF THE INVENTION

According to the present invention, a signal path in an integrated circuit includes a single forcing transistor coupled to an initial portion of the signal path, at least one transmission gate in the signal path, a clock circuit for forcing the clock inputs of the transmission gate to be conductive during a standby mode, and additional alternate power-gated circuitry in the signal path, wherein a forced data state generated by the single forcing transistor propagates through the entire signal path. The circuit of the present invention works with synchronous circuits including full cycle latches, half cycle latches, as well as combinatorial logic circuits, or combinations thereof.

In a specific embodiment of the invention, a full cycle latch includes a forcing transistor having a gate for receiving a control signal and a drain for receiving an input signal, a first transmission gate having an input for receiving the input signal, a first latch stage having an input coupled to the output of the first transmission gate, a second transmission gate having an input coupled to the output of the first latch stage, a second latch stage having an input coupled to the output of the second transmission gate and an output for providing an output signal, and a clock circuit for forcing the first and second transmission gates to be conductive during a standby mode of operation.

This circuit of the present invention is operated according to a method that reduces the number of nodes that must be forced during a standby mode when using clocked latches. The circuit and method of the present invention can be used with is half-cycle and full cycle latches, even when many stages are cascaded in a pipeline structure.

The circuit of the present invention modifies the clock signals to the transmission gates in a synchronous latch circuit so that a single forcing node data state can be passed through one or more cascaded latch stages.

Other features, objects, and advantages of the present invention are apparent from the accompanying drawings and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

Figure 1:
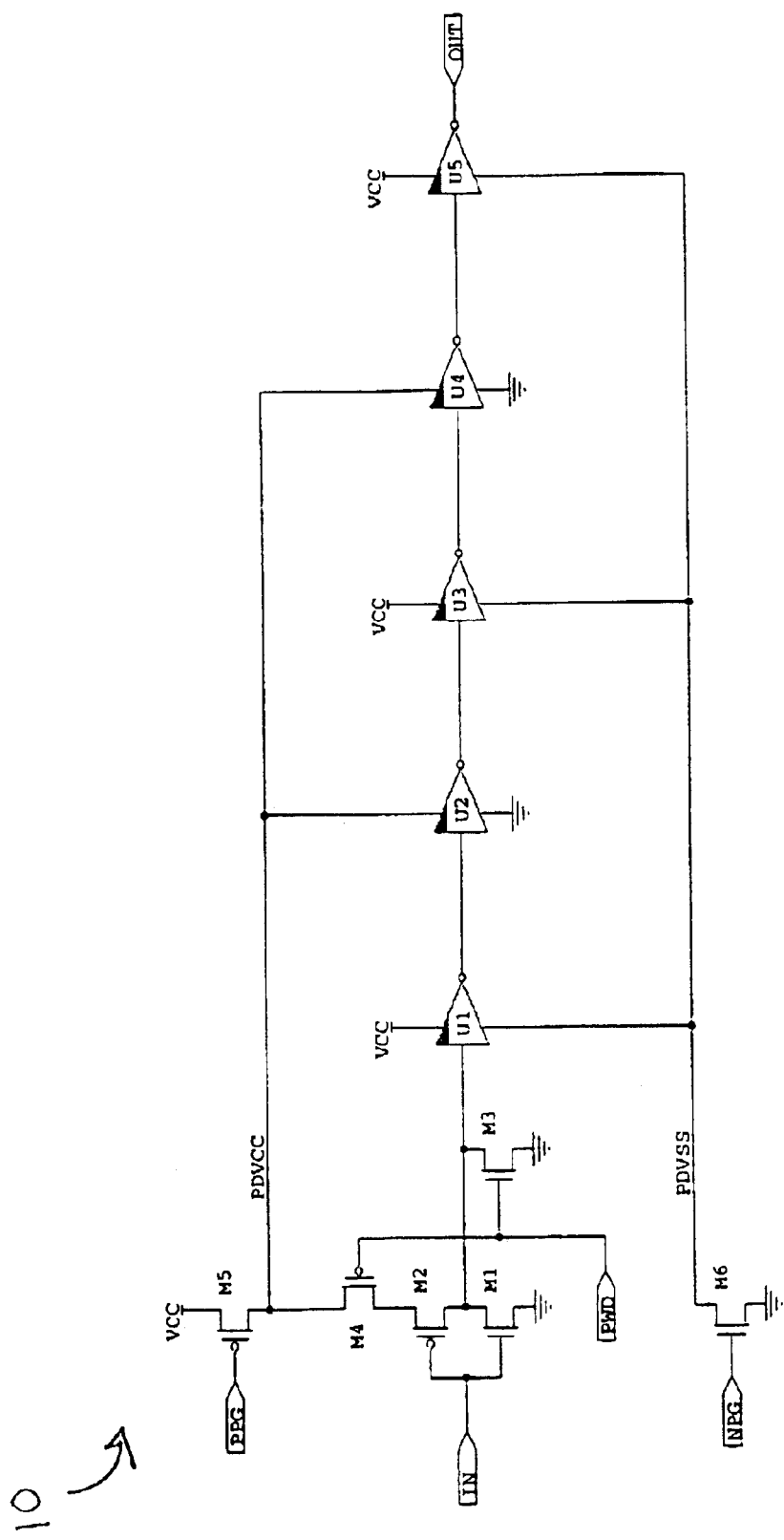
FIGS. 1–5 are schematic diagrams of prior art power-gating circuitry for implementing a power-down or standby mode of operation.
Figure 3:
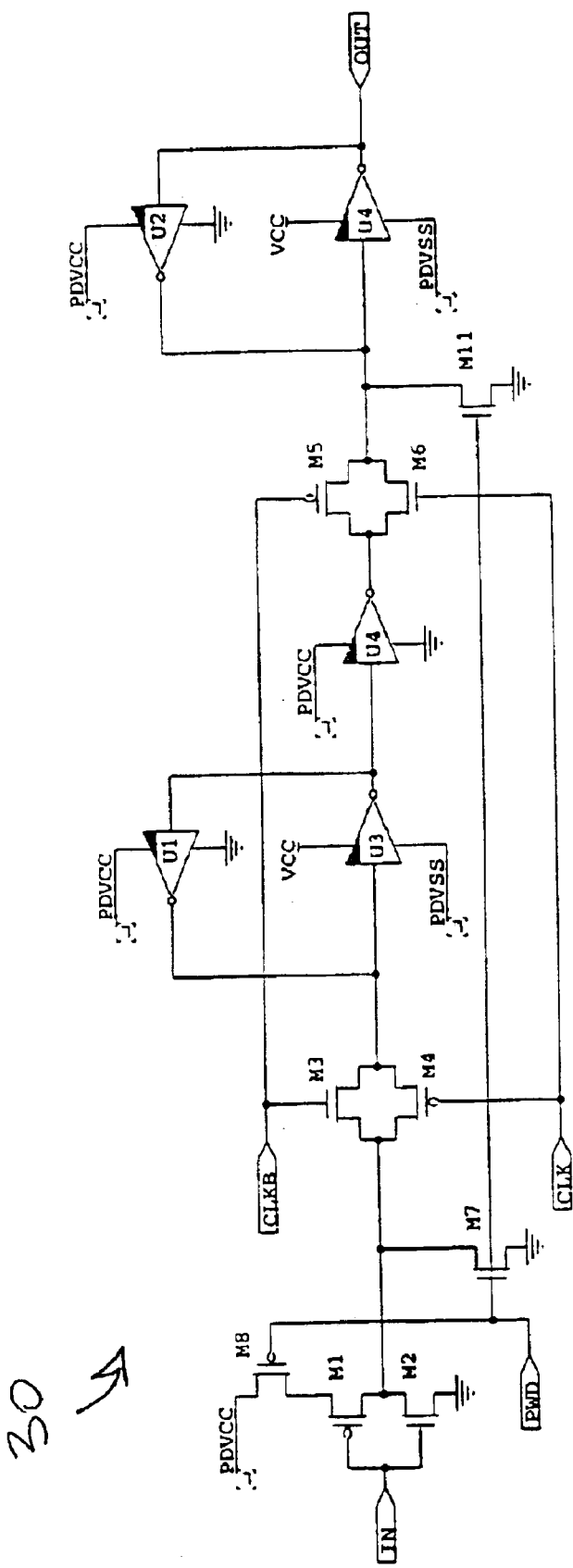
Figure 3:
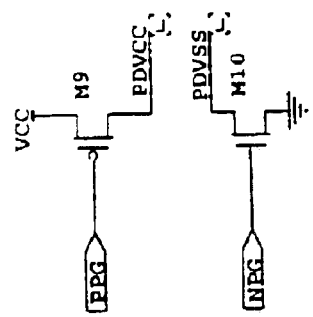
Figure 4:
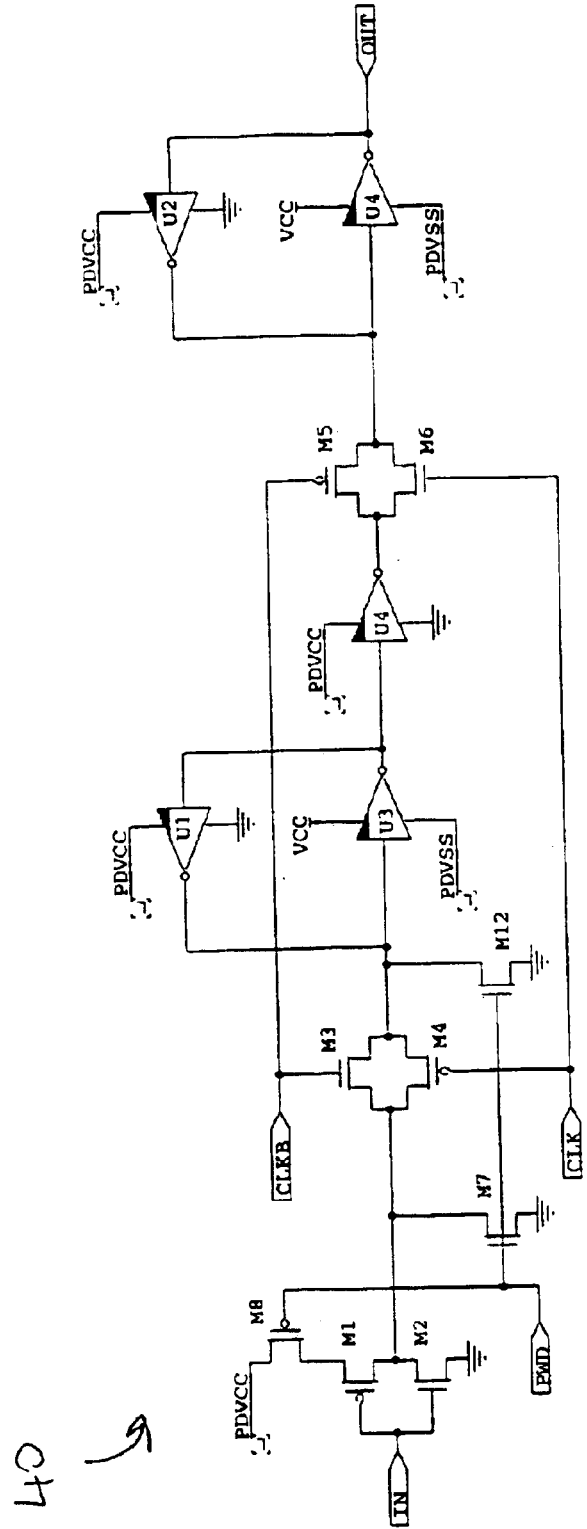
Figure 4:
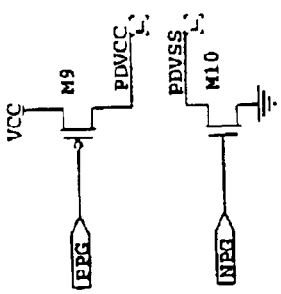
Figure 5:
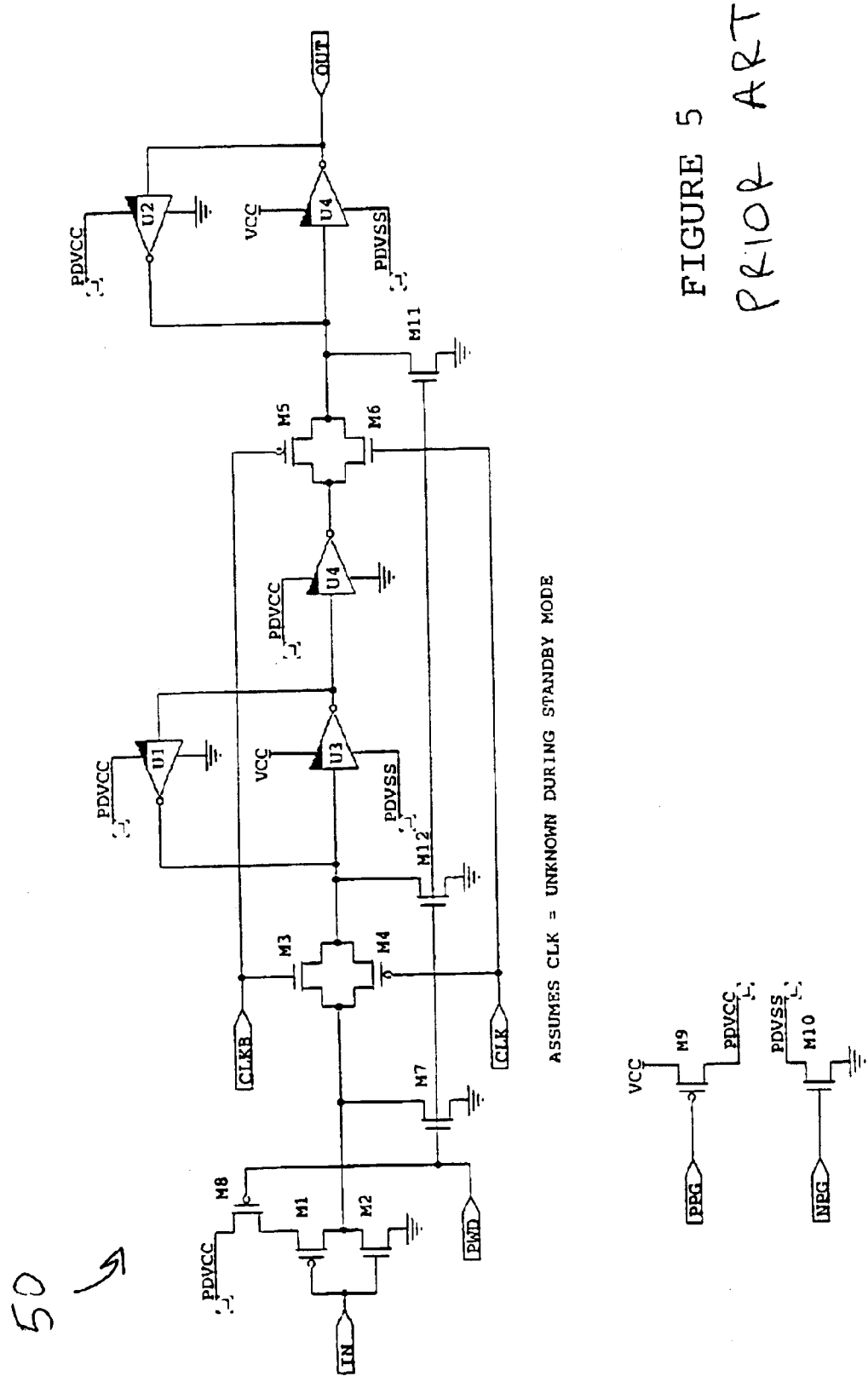
Figure 6:
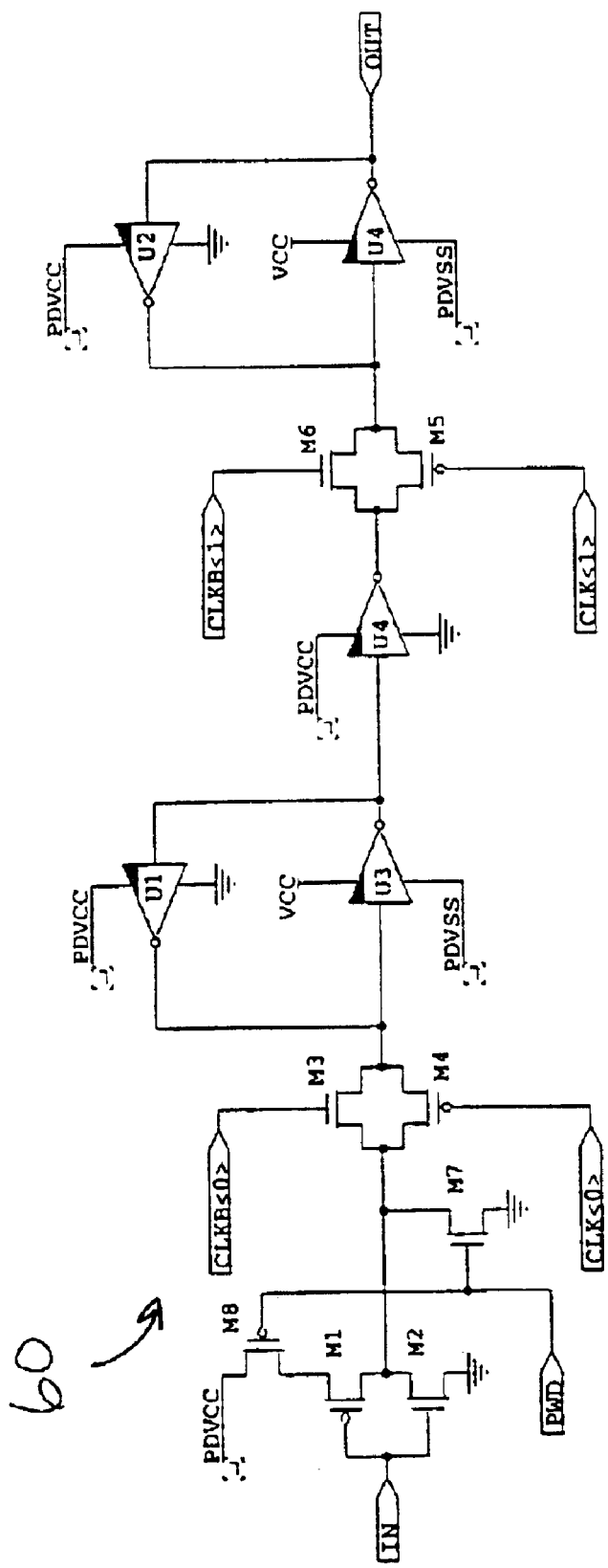
FIG. 6 is a schematic diagram of a full cycle latch according to the present invention.
Figure 6:
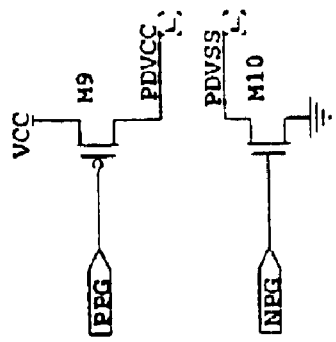

Referring now to FIG. 6, a full cycle synchronous latch circuit 60 is shown. Separate clocks (CLK<0:1> and CLKB<0:1>) are used for each latched stage. During normal operation (non-standby), CLK<0> and CLK<1> are 180 degrees out of phase. However, when in standby mode, CLK<0> and CLK<1> are both low, which enables both transmission gates (including N-channel transistor M3 and P-channel transistor M4 in a first transmission gate and P-channel transistor M5 and N-channel transistor M6 in a second transmission gate) to allow a forced data state, generated by transistor M7, under command of the PWD control signal, to propagate through the latch stages. A first latch stage includes cross-coupled inverters U1 and U3. A second latch stage includes cross-coupled inverters U2 and U4. Note that the first and second latch stages each include power-gated VCC and VSS power supply terminals, as well as non-gated VCC and ground power supply terminals. By forcing the clock inputs of the first and second transmission gates to be conductive during the standby mode, multiple stages can be set to a data specific state. The initial data state is determined by an earlier stage being set to that state by a single forcing transistor M7.

Figure 7:
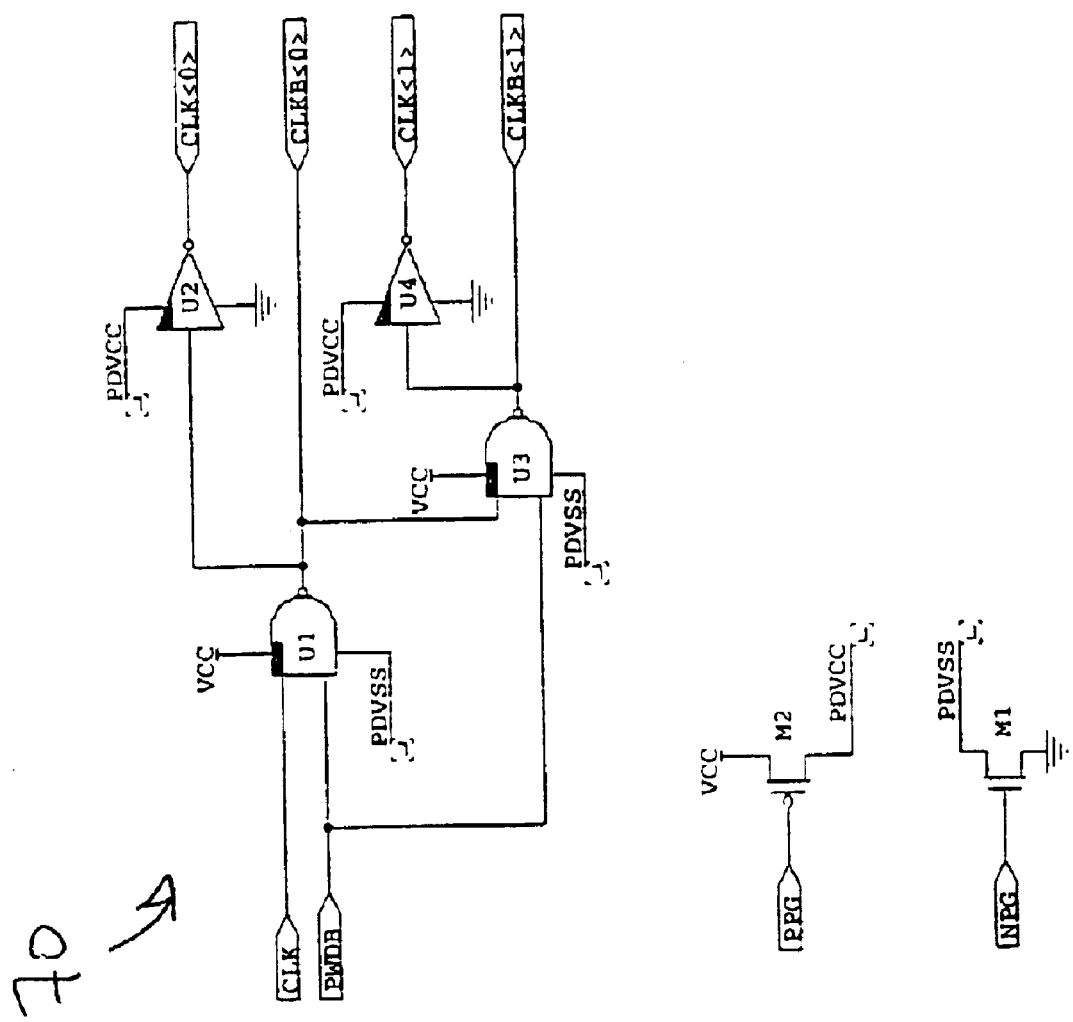
FIG. 7 is a schematic diagram of a clock circuit for use with the full cycle latch of FIG. 6.

Referring now to FIG. 7, a clock circuit 70 is shown for generating the clock signals used in both the normal operating mode and the standby mode for the full cycle latch circuit 60 shown in FIG. 6. Clock circuit 70 includes a CLK input for receiving a system clock signal, as well as a PWDB power-down control signal. Clock circuit 70 also has four outputs CLK<0>, CLKB<0>, CLK<1>, and CLKB<1> for generating the four separate clock signals required for latch 60. A first NAND gate U1 receives the CLK and PWDB signal and generates the CLKB<0> output. A second NAND gate U3 is coupled to the output of gate U1 and also receives the PWDB signal. NAND gate U3 also generates the CLKB<1> clock signal. A first inverter U2 is coupled to the output of NAND gate U1 and generates the CLK<0> signal. A second inverter U4 is coupled to the output of NAND gate U3 and generates the CLK<1> signal. In operation, clock circuit 70 generates clock signal that are 180 degrees out of phase for the first and second latch stages, whereas in the standby mode, the clock signal generation is changed so that the clocks have the same phase, and the inverted clock signals also have the same phase. Note in FIG. 7 that logic gates U1 and U3 are powered through VCC and PDVSS (switched during standby mode via transistor M1), and inverters U2 and U4 are powered through PDVCC (switched during standby mode via transistor M2) and ground.

Figure 8:
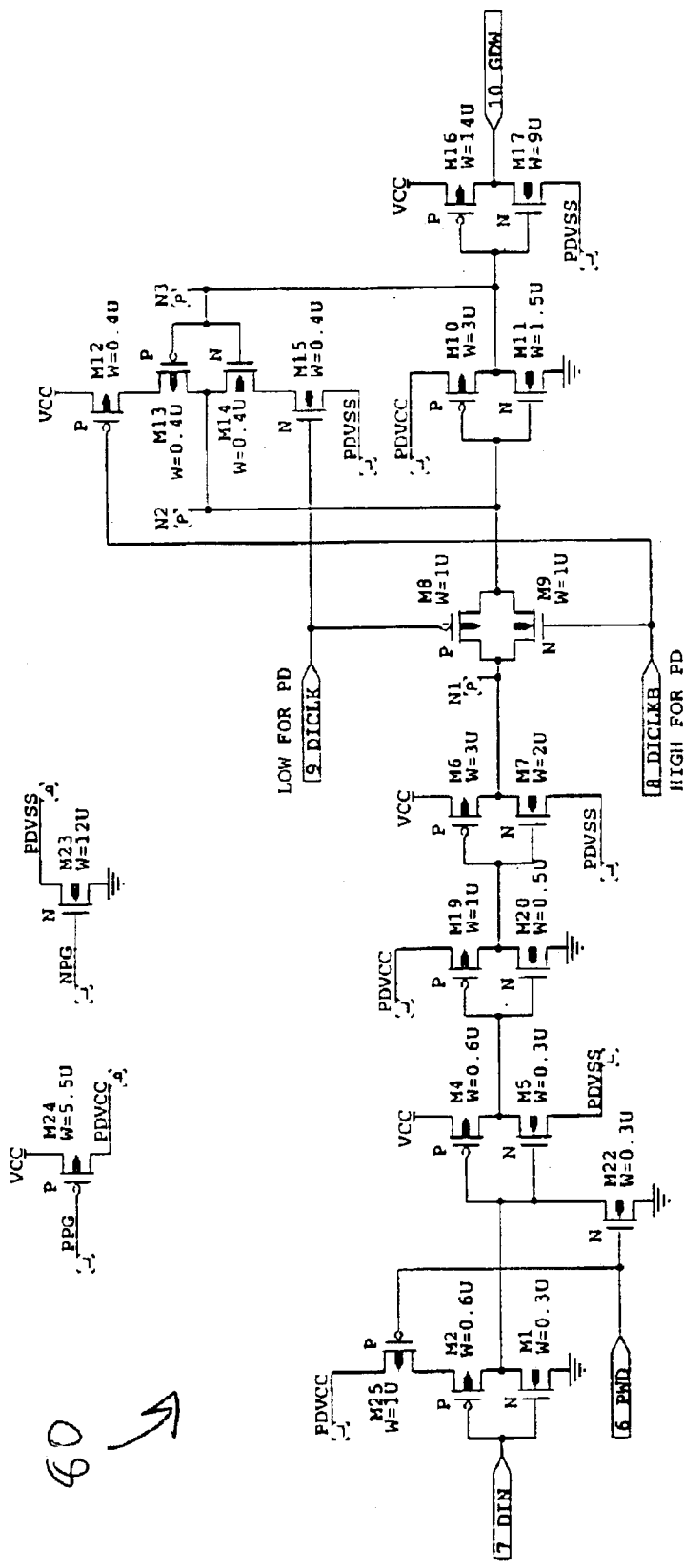
FIG. 8 is a schematic diagram of a half cycle latch according to the present invention.
Figure 8:
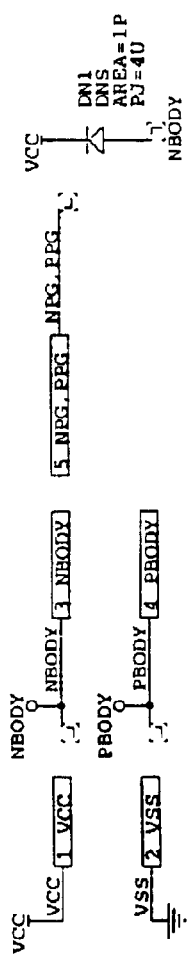

A half cycle latch circuit 80 is shown in FIG. 8. Latch circuit 80 also includes a number of input inverter stages to illustrate how a forced data state can ripple through additional alternate power-gated circuitry as well as the latch circuits of the present invention. From left to right in FIG. 8, circuit 80 includes a DIN data input and an input inverter stages including P-channel transistors M2 and M25, and N-channel transistor M1. A single forcing transistor M22 has a gate for receiving a PWD power-down control signal, a drain coupled to the next inverter stage, and a source coupled to ground The next three inverter stages include: P-channel transistor M4 and N-channel transistor M5; P-channel transistor M19 and N-channel transistor M20; and P-channel transistor M6 and N-channel transistor M7. Note that the alternate power-gating technique is used whereby the drains of transistors M25 and M19 are coupled to the gated PDVCC power supply and the drains of transistors M4 and M6 are coupled to the non-gated VCC power supply. Similarly, the sources of transistors M5 and M7 are coupled to the gated PDVSS power supply and the sources of transistors M1 and M20 are coupled to the non-gated ground terminal. A transmission gate includes P-channel transistor M8 in parallel with N-channel transistor M9. The clock inputs receive the DICLK and DICLKB clock signals. A latch stage includes a first inverter including P-channel transistor M10 and N-channel transistor M11. The latch stage also includes a second cross-coupled inverter including P-channel transistors M12 and M13, and N-channel transistors M14 and M15. Note that the first inverter is powered between PDVCC and ground, and the second inverter is powered between VCC and PDVSS. A final inverter in circuit 80 includes P-channel transistor M16 coupled to VCC and a N-channel transistor M17 coupled to PDVSS. The data state provided by forcing transistor M22 is passed through the entire signal path of circuit 80 when it is placed into the standby mode. Since the data state itself is carried throughout the data path, additional forcing transistors are not needed and precious integrated circuit area is preserved.

Figure 9:
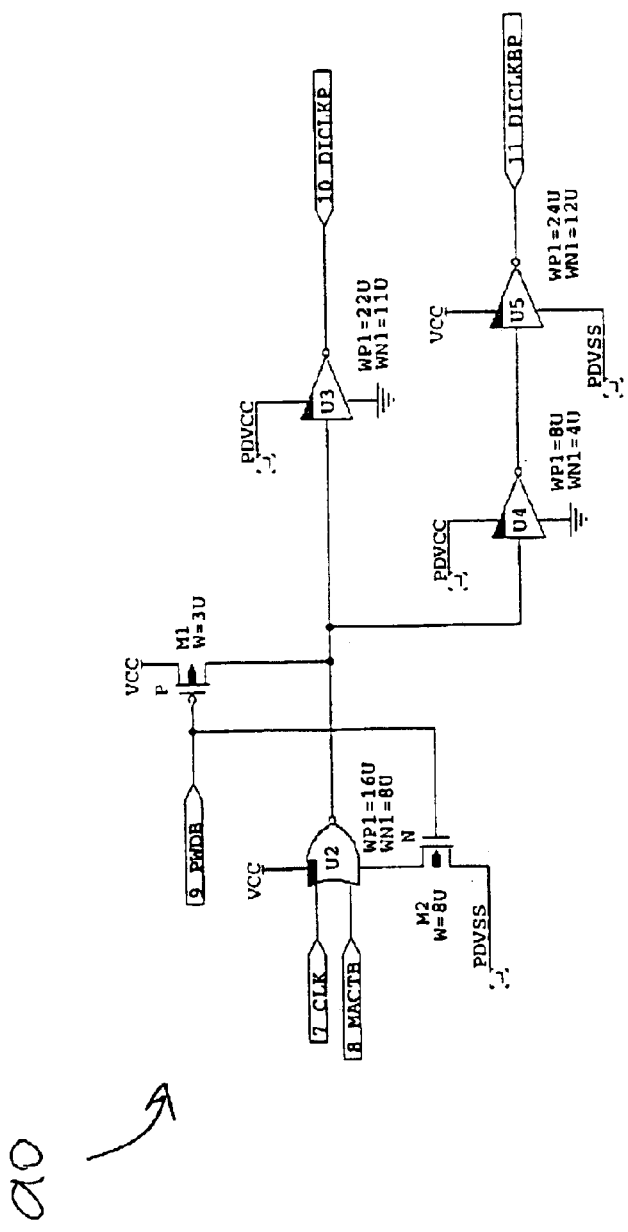
FIG. 9 is a schematic diagram of a clock circuit for use with the half cycle latch of FIG. 8.
Figure 9:
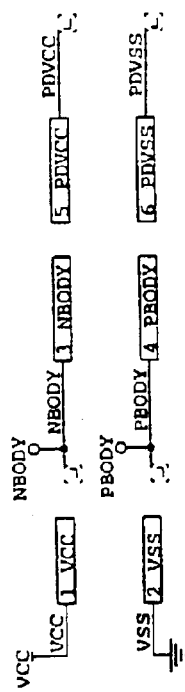
Figure 1:
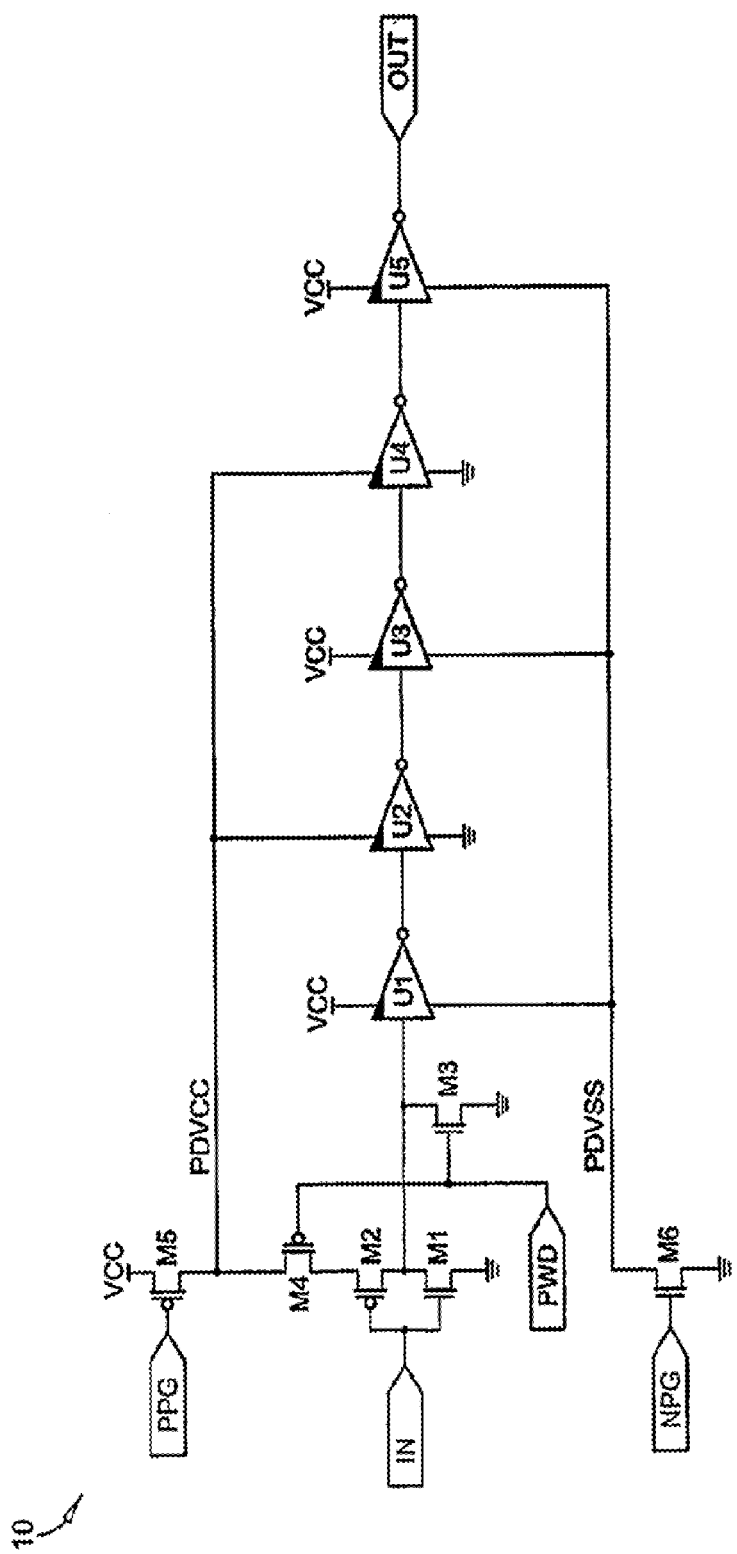
Figure 2:
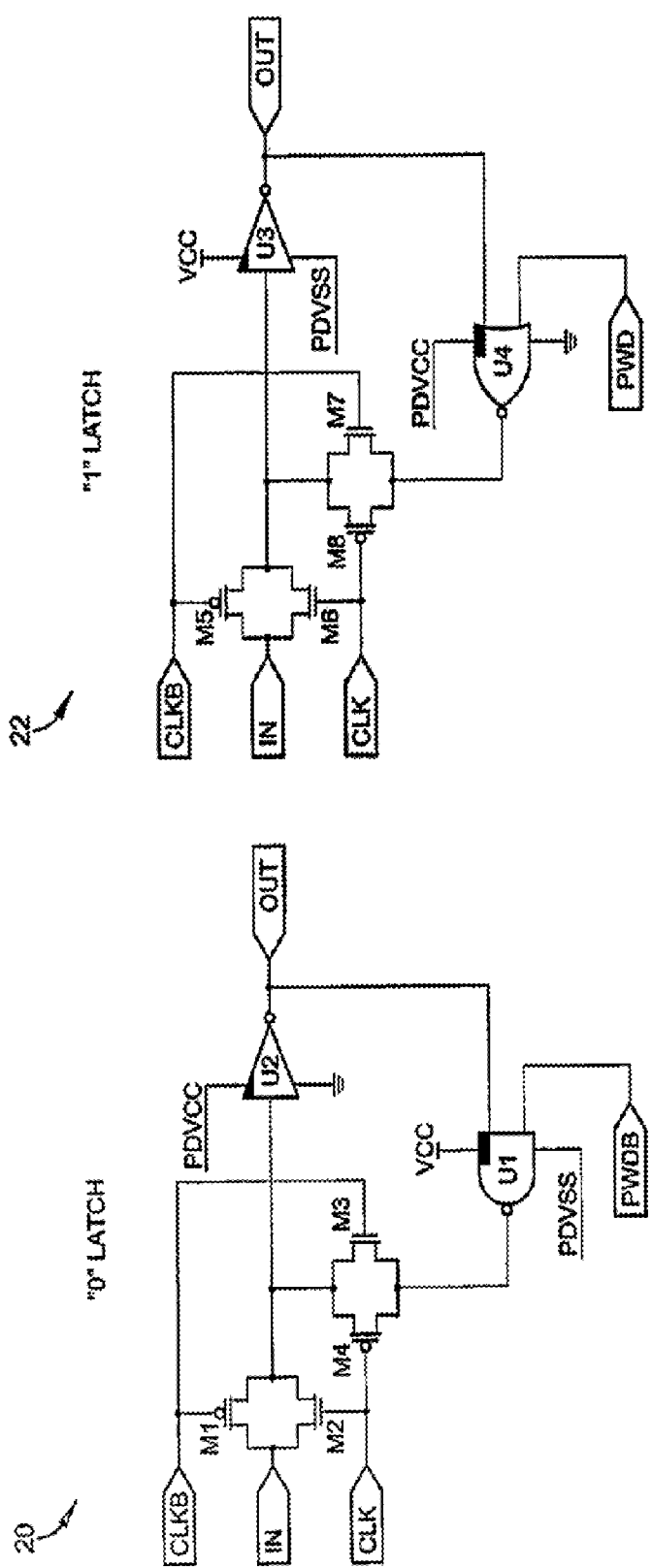
Figure 3:
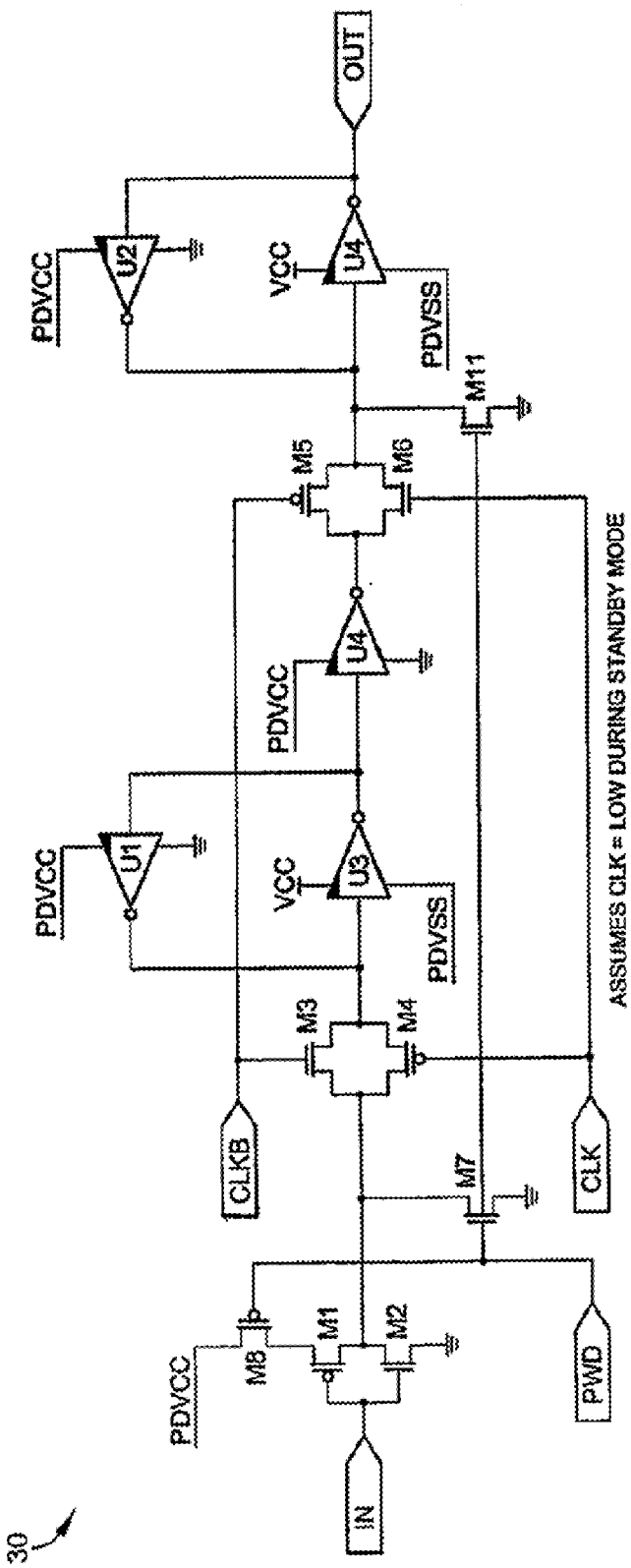
Figure 4:
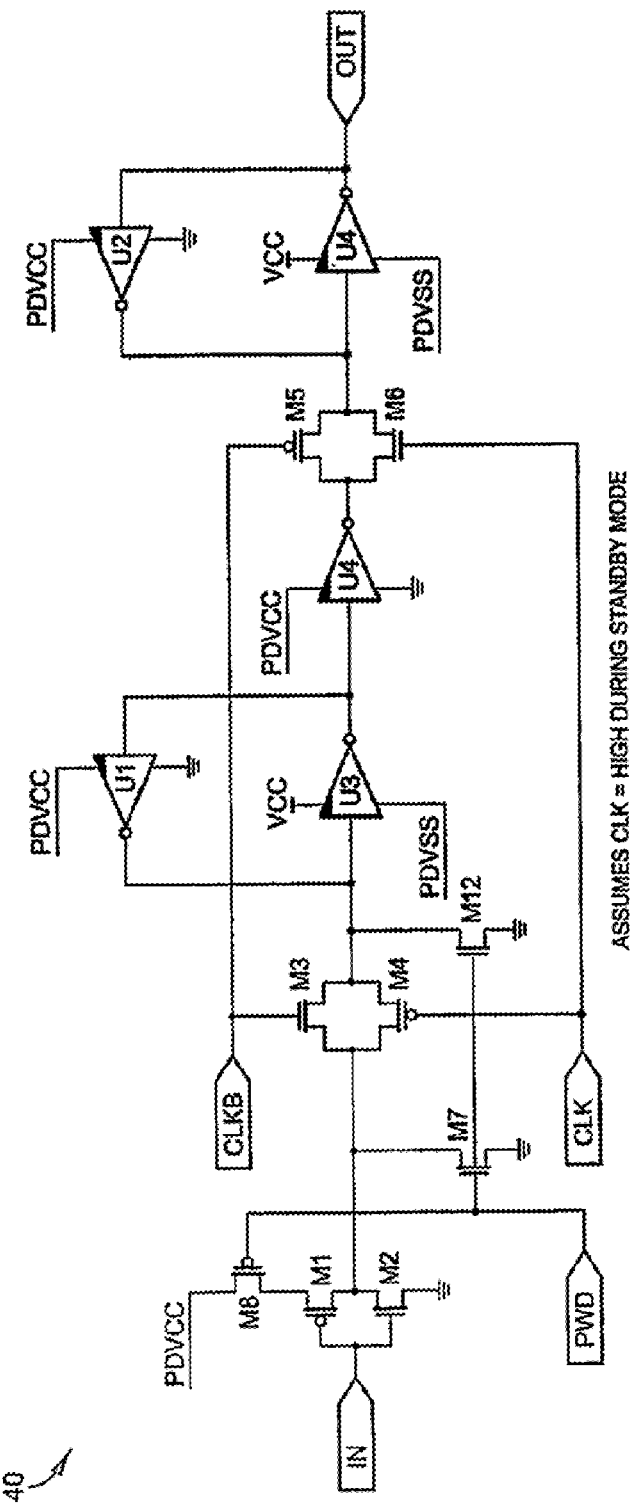
Figure 5:
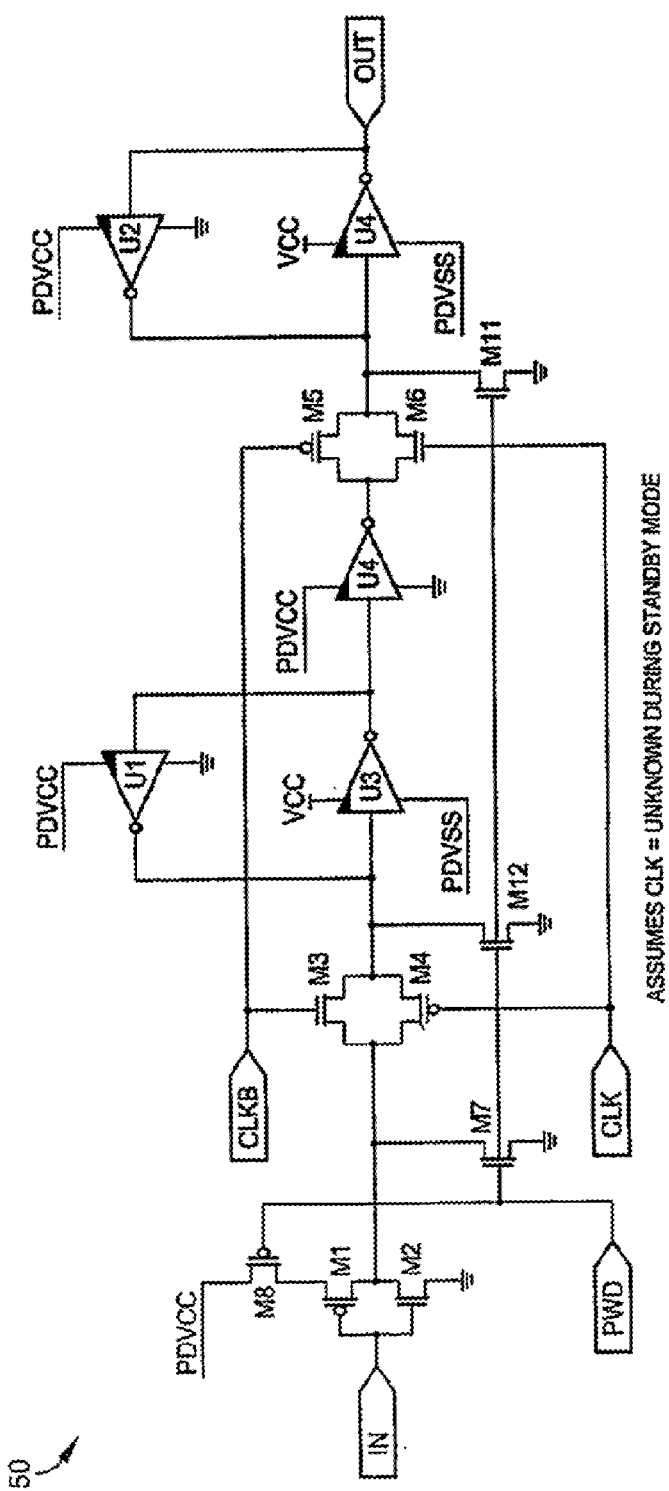
Figure 6:
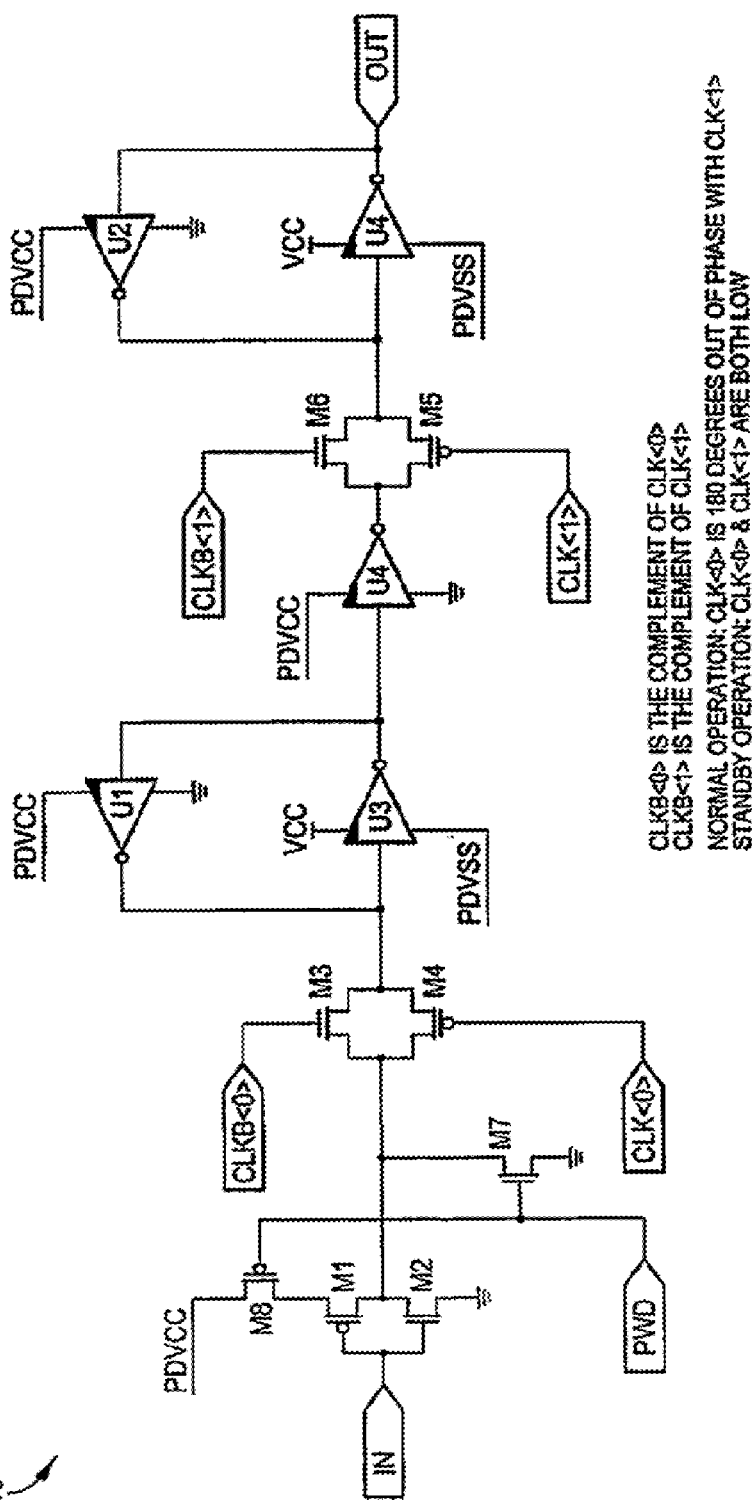
Figure 7:
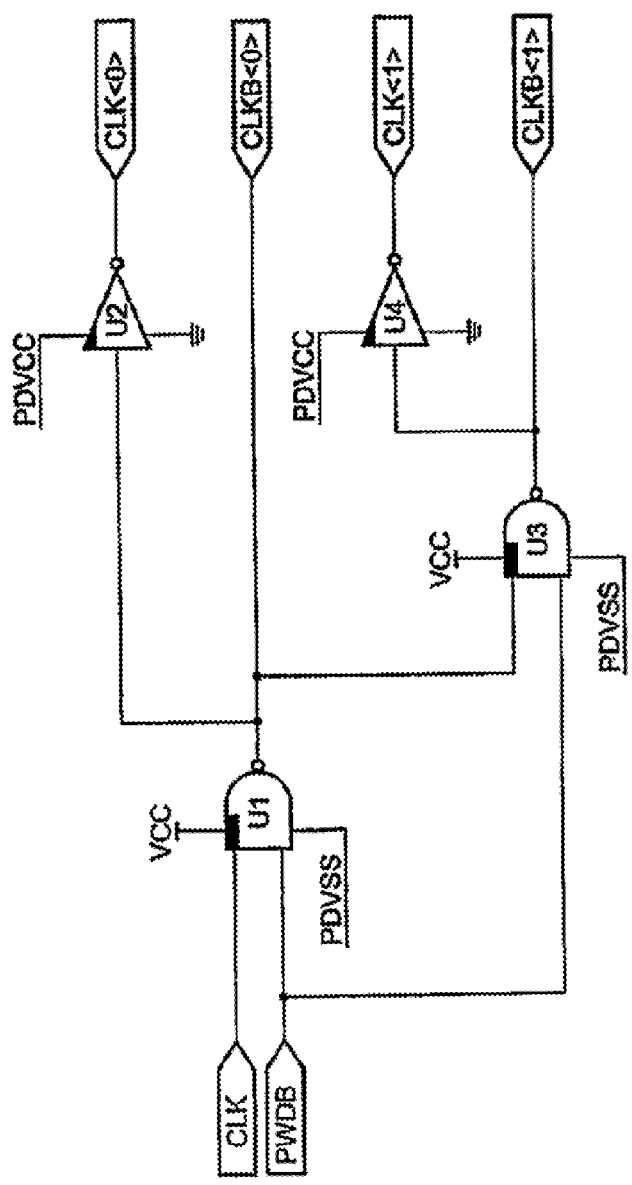
Figure 8:
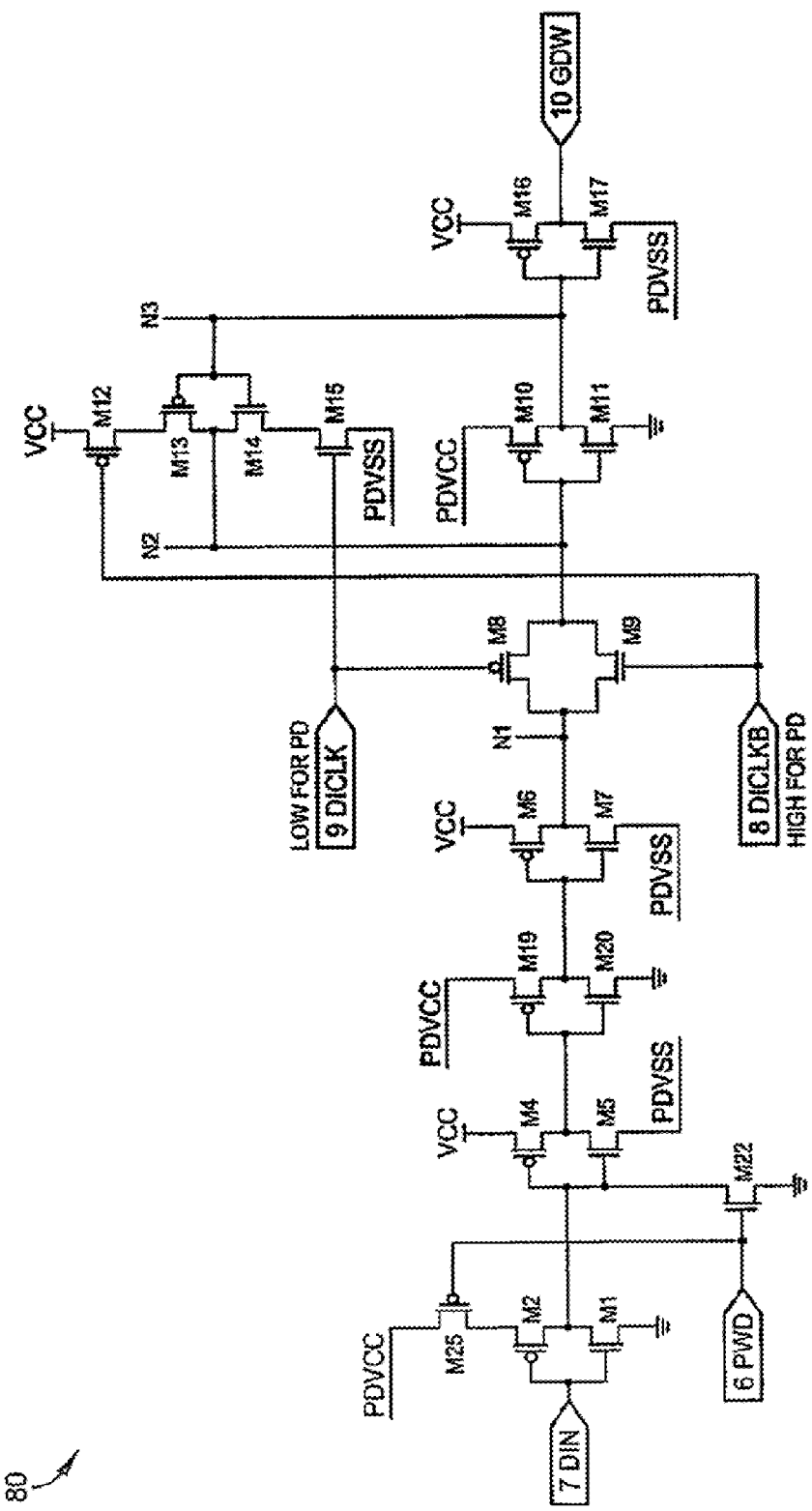
Figure 9:
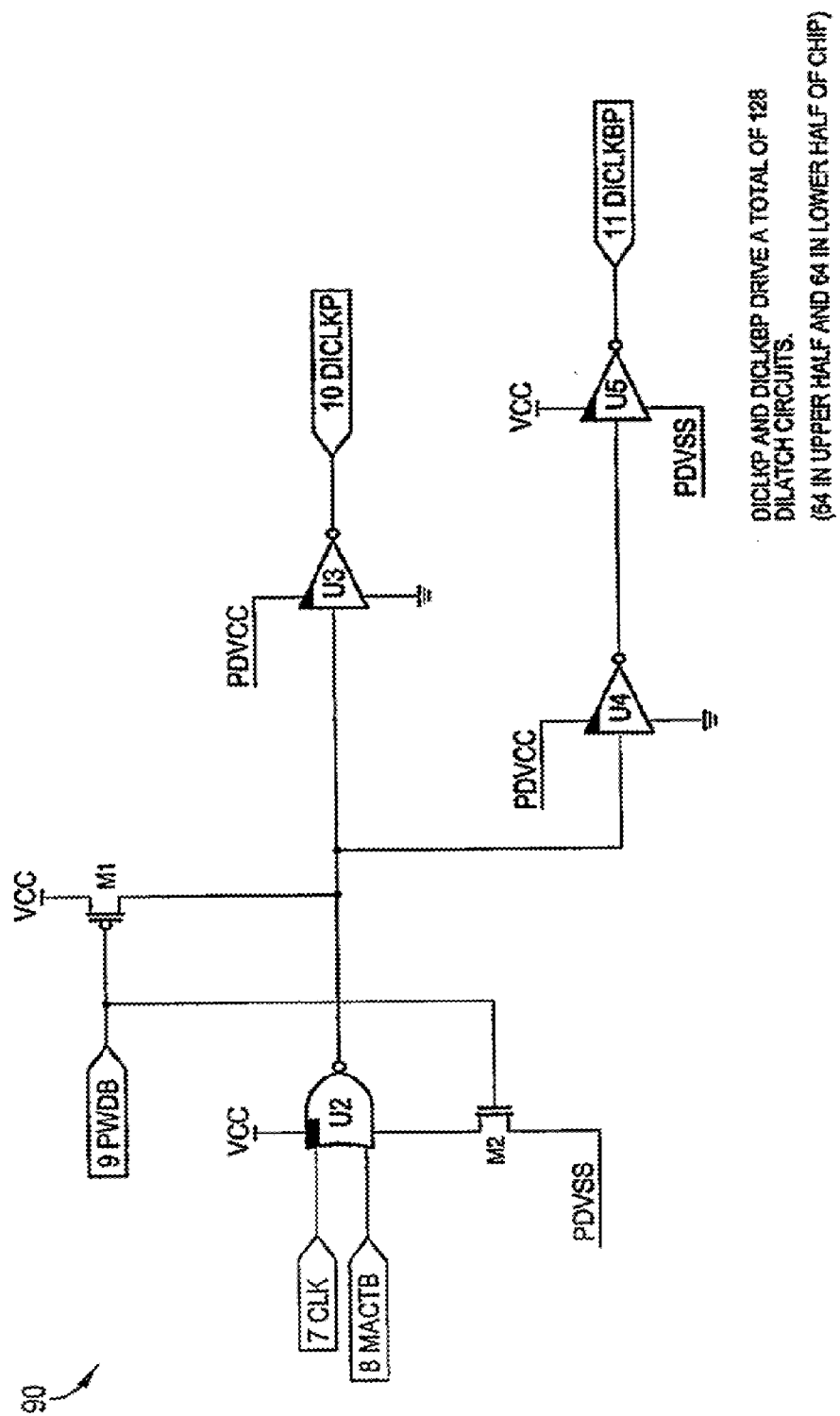

While circuit 80 includes only one transmission gate, a special clock circuit is nonetheless required to provide the DICLK and DICLKB signal in both the normal and standby operating modes. Such a clock circuit 90 is shown in FIG. 9. Referring now to FIG. 9, a clock circuit 90 is shown for generating the clock signals used in both the normal operating mode and the standby mode for the half cycle latch circuit 80 shown in FIG. 8. Clock circuit 90 includes a CLK input for receiving a system clock signal, a MACTB input for receiving a mask signal, as well as a PWDB power-down control signal. The MACTB input stands for Memory Active Low True, which causes all phases of the clock to toggle only when the memory is active. Clock circuit 90 also has two outputs DICLK and DICLKB for generating the two separate clock signals required for latch circuit 80. A first NOR gate U2 receives the CLK and MACTB signals. A first transistor M1 is coupled to the output of gate U2 and also receives the PWDB signal. A second transistor M2 is coupled to a power terminal of gate U2 and also receives the PWDB signal. Transistor M1 is powered via VCC and transistor M2 is powered via PDVSS. A first inverter U3 is coupled to the output of NOR gate U2 and generates the DICLK signal. A second inverter U4 is coupled to the output of NOR gate U2. A third inverter U5 is coupled to the output of inverter U4 and generates the DICLKB signal. In operation, clock circuit 90 generates clock signals that are 180 degrees out of phase in a normal mode of operation, whereas in the standby mode, the clock signal generation is changed so that the clocks have the same phase. Note in FIG. 9 that logic gates U1 and inverter U5 are powered through VCC and PDVSS (switched during standby mode via transistor M1), and inverters U3 and U4 are powered through PDVCC (switched during standby mode via transistor M2) and ground.

In the foregoing specification, the invention has been described with reference to specific exemplary embodiments thereof It will, however, be appreciated by those skilled in the art that various modifications and changes may be made thereto without departing from the broader spirit and scope of the invention as set forth in the appended claims. The specification and drawings are, accordingly, to be regarded in an illustrative rather than a restrictive sense.

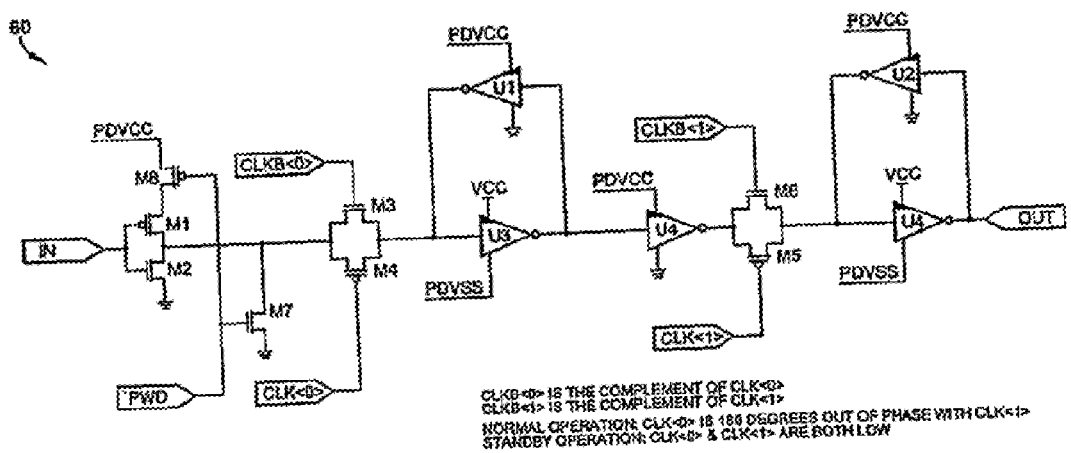

What is claimed is:

1. A full cycle latch comprising:
   a forcing transistor having a gate for receiving a control signal and a drain for receiving an input signal;
   a first transmission gate having an input for receiving the input signal, and an output;
   a first latch stage having an input coupled to the output of the first transmission gate and an output;
   a second transmission gate having an input coupled to the output of the first latch stage, and an output:

a second latch stage having an input coupled to the output of the second transmission gate and an output for providing an output signal; and means for forcing the first and second transmission gates to be conductive during a standby mode of operation.

2. A full cycle latch as in claim 1 wherein the means for forcing the first and second transmission gates to be conductive comprises a clock circuit for controlling clock inputs of the transmission gate.

3. A full cycle latch as in claim 2 wherein the clock circuit comprises:

a clock input;

a control input;

a first power terminal for receiving a power-gated VCC supply voltage;

a second power terminal for receiving a power-gated VSS supply voltage; and first, second, third, and fourth clock outputs.

4. A full cycle latch as in claim 3 wherein the clock circuit further comprising a third power terminal, for receiving a non-power-gated VCC supply voltage.

5. A full cycle latch as in claim 1 wherein the first and second transmission gate each comprise a P-channel clock input and an N-channel clock input.

6. A full cycle latch as in claim 5 wherein the means for forcing the first and second transmission gates to be conductive comprises a dock circuit for forcing a logic zero on the P-channel clock inputs and a logic one on the N-channel clock inputs.

7. A full cycle latch as in claim 1 wherein the first latch stage comprises a first power terminal for receiving a power-gated VCC supply voltage and a second power terminal for receiving a non-power-gated VCC supply voltage.

8. A full cycle latch as in claim 1 wherein the second latch stage comprises a first power terminal for receiving a power-gated VCC supply voltage and a second power terminal for receiving a non-power-gated VCC supply voltage.

9. A full cycle latch as in claim 1 wherein the first latch stage comprises a power terminal for receiving a power-gated VSS supply voltage.

10. A full cycle latch as in claim 1 wherein the second latch stage comprises a power terminal for receiving a power-gated VSS supply voltage.

* * * * *

UNITED STATES PATENT AND TRADEMARK OFFICE
CERTIFICATE OF CORRECTION

PATENT NO.    : 6,788,122 B2                                               Page 1 of 1
DATED         : September 7, 2004
INVENTOR(S)   : Oscar Frederick Jones, Jr.

It is certified that error appears in the above-identified patent and that said Letters Patent is hereby corrected as shown below:

<u>Title page,</u>
Item [57], ABSTRACT,
Line 12, after "generation" delete "."

<u>Column 5,</u>
Line 20, after "terminal" delete ","

<u>Column 6,</u>
Line 6, "dock" should be -- clock --

Signed and Sealed this

Twenty-sixth Day of April, 2005

JON W. DUDAS
*Director of the United States Patent and Trademark Office*

UNITED STATES PATENT AND TRADEMARK OFFICE
CERTIFICATE OF CORRECTION

PATENT NO. : 6,788,122 B2
APPLICATION NO. : 10/354307
DATED : September 7, 2004
INVENTOR(S) : Oscar Frederick Jones, Jr.

It is certified that error appears in the above-identified patent and that said Letters Patent is hereby corrected as shown below:

The Title Page, showing an illustrative figure, should be deleted and substitute therefor the attach tile page.

Delete drawings sheets 1-9 and substitute therefor the drawing sheets, consisting of figs. 1-9 as shown on the attached page.

Signed and Sealed this

Sixth Day of March, 2007

JON W. DUDAS
*Director of the United States Patent and Trademark Office*

(12) United States Patent
Jones, Jr.

(10) Patent No.: US 6,788,122 B2
(45) Date of Patent: Sep. 7, 2004

(54) CLOCK CONTROLLED POWER-DOWN STATE

(75) Inventor: Oscar Frederick Jones, Jr., Colorado Springs, CO (US)

(73) Assignee: United Memories, Inc., Colorado Springs, CO (US); Sony Corporation, Tokyo (JP)

(*) Notice: Subject to any disclaimer, the term of this patent is extended or adjusted under 35 U.S.C. 154(b) by 0 days.

(21) Appl. No.: 10/354,307

(22) Filed: Jan. 30, 2003

(65) Prior Publication Data
US 2004/0150448 A1 Aug. 5, 2004

(51) Int. Cl.$^7$ .................................... H03K 3/289
(52) U.S. Cl. .................. 327/202; 327/200; 327/203
(58) Field of Search ........................... 327/200, 202, 327/201, 203, 208, 210, 211, 212, 199, 209

(56) References Cited

U.S. PATENT DOCUMENTS

| | | | |
|---|---|---|---|
| 4,843,254 A | * | 6/1989 | Motegi et al. ............ 327/203 |
| 5,973,529 A | * | 10/1999 | Chappell et al. ........... 327/200 |
| 6,169,419 B1 | | 1/2001 | De et al. ................. 326/58 |
| 6,198,323 B1 | * | 3/2001 | Offord .................... 327/202 |
| 6,231,147 B1 | * | 5/2001 | Bosshart ................. 326/202 |

* cited by examiner

Primary Examiner—Tuan T. Lam
Assistant Examiner—Hiep Nguyen
(74) Attorney, Agent, or Firm—Peter J. Meza; William J. Kubida; Hogan & Hartson LLP

(57) ABSTRACT

A circuit and method reduces the number of nodes that must be forced during a standby mode when using clocked latches. The circuit and method can be used for half-cycle latches and full cycle latches in conjunction with alternate power-gated circuitry, even when many stages are cascaded in a pipeline structure. The data state on a single forcing node can be passed through one or more cascaded latch stages as well as through additional circuitry. By forcing latch transmission gates to be conductive during standby mode, multiple stages can be set to a specific state, as determined by an earlier stage being set by a forcing transistor. A clock generation circuit and method is also provided for controlling transmission gates within the latches.

10 Claims, 9 Drawing Sheets